United States Patent
Inatomi et al.

(10) Patent No.: US 9,552,994 B2
(45) Date of Patent: Jan. 24, 2017

(54) PLATING APPARATUS, PLATING METHOD, AND STORAGE MEDIUM

(71) Applicant: Tokyo Electron Limited, Tokyo (JP)

(72) Inventors: Yuichiro Inatomi, Nirasaki (JP); Takashi Tanaka, Nirasaki (JP); Nobutaka Mizutani, Nirasaki (JP); Yusuke Saito, Nirasaki (JP); Mitsuaki Iwashita, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 40 days.

(21) Appl. No.: 14/384,465

(22) PCT Filed: Feb. 22, 2013

(86) PCT No.: PCT/JP2013/054502
§ 371 (c)(1),
(2) Date: Sep. 11, 2014

(87) PCT Pub. No.: WO2013/140938
PCT Pub. Date: Sep. 26, 2013

(65) Prior Publication Data
US 2015/0099355 A1    Apr. 9, 2015

(30) Foreign Application Priority Data
Mar. 19, 2012  (JP) .................................. 2012-062687

(51) Int. Cl.
*H01L 21/288*   (2006.01)
*C23C 18/16*   (2006.01)
*H01L 21/768*  (2006.01)

(52) U.S. Cl.
CPC ........... *H01L 21/288* (2013.01); *C23C 18/163* (2013.01); *C23C 18/1619* (2013.01);
(Continued)

(58) Field of Classification Search
CPC ........................ H01L 21/288; C23C 18/1619
(Continued)

(56) References Cited

U.S. PATENT DOCUMENTS 6,159,291 A * 12/2000 Morita .................... B05C 11/08
                                                            118/320
8,003,509 B2    8/2011 Hara
(Continued)

FOREIGN PATENT DOCUMENTS

| CN | 1633520 A | 6/2005 |
|----|-----------|--------|
| JP | 2003-129250 A | 5/2003 |

(Continued)

OTHER PUBLICATIONS

International Search Report issued in Application No. PCT/JP2013/054502 dated Mar. 26, 2013.

*Primary Examiner* — Moazzam Hossain
(74) *Attorney, Agent, or Firm* — Pearne & Gordon LLP

(57) ABSTRACT

A plating apparatus 20 includes a substrate holding device 110 configured to hold and rotate the substrate 2; a first discharge device 30 configured to discharge a plating liquid toward the substrate 2 held on the substrate holding device 110; and a top plate 21 that is provided above the substrate 2 and has an opening 22. The first discharge device 30 includes a first discharge unit 33 configured to discharge the plating liquid toward the substrate 2, and the first discharge unit 33 is configured to be moved between a discharge position where the plating liquid is discharged and a standby position where the plating liquid is not discharged. Further, the first discharge unit 33 is configured to be overlapped with the opening 22 of the top plate 21 at the discharge position.

7 Claims, 8 Drawing Sheets

(52) U.S. Cl.
CPC ...... *C23C 18/1669* (2013.01); *C23C 18/1676* (2013.01); *H01L 21/76849* (2013.01)

(58) Field of Classification Search
USPC ........................................................ 438/597
See application file for complete search history.

(56) References Cited

U.S. PATENT DOCUMENTS

| | | | | |
|---|---|---|---|---|
| 8,043,440 | B2* | 10/2011 | Nanba | H01L 21/67051 134/26 |
| 2003/0153185 | A1* | 8/2003 | Sakaki | C25D 17/001 438/689 |
| 2004/0182277 | A1* | 9/2004 | Inoue | C23C 18/34 106/1.22 |
| 2004/0234696 | A1* | 11/2004 | Hongo | C23C 18/1619 427/328 |
| 2006/0113185 | A1* | 6/2006 | Kuriyama | C23C 18/1628 204/275.1 |
| 2006/0234508 | A1* | 10/2006 | Shirakashi | H01L 21/67173 438/691 |
| 2007/0134431 | A1* | 6/2007 | Hara | C23C 18/1619 427/437 |
| 2008/0241387 | A1* | 10/2008 | Keto | C23C 16/452 427/255.394 |
| 2009/0253258 | A1* | 10/2009 | Hara | C23C 18/1628 438/597 |
| 2010/0310772 | A1* | 12/2010 | Tsuda | C23C 16/409 427/255.28 |
| 2011/0073482 | A1* | 3/2011 | Kuriyama | C23C 18/1628 205/125 |

FOREIGN PATENT DOCUMENTS

JP     2009-249679 A     10/2009
WO     03/014416 A2     2/2003

* cited by examiner

PLATING APPARATUS, PLATING METHOD, AND STORAGE MEDIUM

CROSS-REFERENCE TO RELATED APPLICATION

This Application is a U.S. national phase application under 35 U.S.C. §371 of PCT Application No. PCT/JP2013/054502 filed on Feb. 22, 2013, which claims the benefit of Japanese Patent Application No. 2012-062687 filed on Mar. 19, 2012, the entire disclosures of which are incorporated herein by reference.

TECHNICAL FIELD

The embodiments described herein pertain generally to a plating apparatus and a plating method of performing a plating process by supplying a plating liquid to a surface of a substrate, and a storage medium.

BACKGROUND

In general, on a surface of a substrate such as a semiconductor wafer or a liquid crystal substrate, there is formed a wiring for forming a circuit on the surface. Such a wiring has been formed of copper having a low electrical resistance and a high reliability instead of aluminum. In general, a damascene method is used to form a Cu wiring on the substrate, and this method includes forming a recess such as via hole or trench for burying a wiring in an insulating film on the substrate by etching and burying the Cu wiring therein. Further, there has been made an attempt to enhance an EM tolerance of a semiconductor device by supplying a plating liquid containing CoWB (cobalt-tungsten-boron) or CoWP (cobalt-tungsten-phosphorous) to a surface of the substrate including the Cu wiring and by forming a metal film called a cap metal on the Cu wiring by electroless plating.

For example, in Patent Document 1, there is described a plating apparatus including a substrate rotation unit of rotating a substrate and a nozzle of discharging a plating liquid onto the substrate. In the plating apparatus described in Patent Document 1, since the plating liquid is supplied to the substrate being rotated, a uniform flow of the plating liquid is formed on a surface of the substrate. Thus, a plating process is uniformly performed on the entire surface of the substrate.

The electroless plating is known to be affected by reaction conditions such as a composition and a temperature of a plating liquid. Meanwhile, when the plating liquid is supplied to the substrate being rotated, the plating liquid flows from a central portion of the substrate toward a periphery portion thereof. Therefore, it is assumed that a temperature of the plating liquid on the substrate decreases as the plating liquid flows from the central portion of the substrate toward the periphery portion thereof. Therefore, the reaction conditions of the plating liquid are different between the central portion of the substrate and the periphery portion of the substrate. In order to suppress such non-uniformity of the reaction conditions, Patent Document 1 suggests a method of discharging a plating liquid while moving a nozzle between a central portion of a substrate and a periphery portion of the substrate.

REFERENCES

Patent Document 1: Japanese Patent Laid-open Publication No. 2009-249679

DISCLOSURE OF THE INVENTION

Problems to be Solved by the Invention

If a temperature of the ambient atmosphere of a substrate is lower than a temperature of a plating liquid, the plating liquid reaching the substrate loses heat to the ambient atmosphere of the substrate. Therefore, even if a plating liquid is discharged while moving a nozzle, a temperature of the plating liquid which has previously reached the substrate is lower than a temperature of the plating liquid which is discharged from the nozzle and just reaches the substrate. Therefore, it is assumed that a reaction condition of the plating liquid varies depending on a position on the substrate, so that a thickness of a plating layer to be formed is not uniform.

In view of the foregoing, example embodiments provide a plating apparatus and a plating method capable of effectively solving such a problem, and a storage medium.

Means for Solving the Problems

In a first aspect of example embodiments, a plating apparatus of performing a plating process by supplying a plating liquid to a substrate includes a substrate holding device configured to hold and rotate the substrate; a first discharge device configured to discharge the plating liquid toward the substrate held by the substrate holding device; and a top plate that is provided above the substrate and has an opening. The first discharge device includes a first discharge unit configured to discharge the plating liquid toward the substrate, and the first discharge unit is configured to be moved between a discharge position where the plating liquid is discharged and a standby position where the plating liquid is not discharged. Further, the first discharge unit is configured to be overlapped with the opening of the top plate at the discharge position.

In a second aspect of example embodiments, a plating method of performing a plating process by supplying a plating liquid to a substrate includes a holding process of holding the substrate by a substrate holding device; an arranging process of positioning a top plate including an opening above the substrate; and a plating process of discharging the plating liquid from the opening toward the substrate. Further, during the plating process, a flow of a gas flowing from the opening of the top plate toward the substrate is impeded.

In a third aspect of example embodiments, a computer-readable storage medium has stored thereon computer-executable instructions that, in response to execution, cause a plating apparatus to perform a plating method. The plating method includes a holding process of holding a substrate by a substrate holding device; an arranging process of positioning a top plate including an opening above the substrate; and a plating process of discharging a plating liquid from the opening toward the substrate. During the plating process, a flow of a gas flowing from the opening of the top plate toward the substrate is impeded.

Effect of the Invention

In accordance with the example embodiments, a temperature of the ambient atmosphere of the substrate can be maintained by the top plate and the first discharge unit of the first discharge device provided to be overlapped with the opening of the top plate. Therefore, it is possible to efficiently suppress a decrease in the temperature of the plating liquid discharged toward the substrate. Thus, it is possible to suppress a difference in the temperature of the plating liquid depending on a position on the substrate. Accordingly, a plating layer having a uniform thickness can be formed.

MODE FOR CARRYING OUT THE INVENTION

Figure 1:
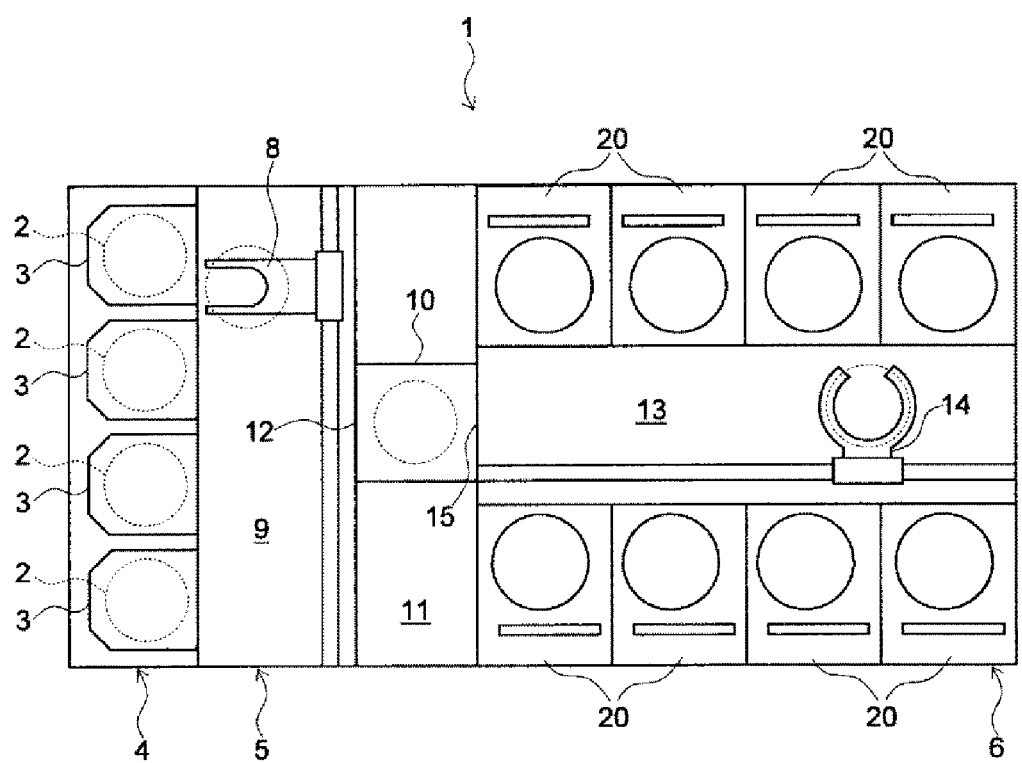
FIG. 1 is a plane view showing an overall configuration of a plating system in accordance with an example embodiment.

Hereinafter, referring to FIG. 1 to FIG. 7H, an example embodiment will be explained. Referring to FIG. 1, an overall configuration of a plating system 1 in accordance with the present example embodiment will be explained first.

Plating System

As depicted in FIG. 1, the plating system 1 includes a substrate loading/unloading chamber 5 configured to mount a carrier 3 that accommodates multiple sheets (for example, 25 sheets) of substrates 2 (herein, semiconductor wafers) and configured to load and unload a preset number of the substrates 2; and a substrate processing chamber 6 configured to perform various processes, such as a plating process or a cleaning process, on the substrates 2. The substrate loading/unloading chamber 5 and the substrate processing chamber 6 are provided to be adjacent to each other.

(Substrate Loading/Unloading Chamber)

The substrate loading/unloading chamber 5 includes a carrier mounting unit 4, a transfer chamber 9 that accommodates a transfer device 8, and a substrate delivery chamber 11 that accommodates a substrate delivery table 10. In the substrate loading/unloading chamber 5, the transfer chamber 9 and the substrate delivery chamber 11 communicate with each other via a delivery opening 12. On the carrier mounting unit 4, multiple carriers 3 each accommodating the multiple substrates 2 in a horizontal posture are mounted. In the transfer chamber 9, the substrate 2 is transferred, and in the substrate delivery chamber 11, the substrate 2 is delivered with respect to the substrate processing chamber 6.

In the substrate loading/unloading chamber 5, a preset number of the substrates 2 are transferred by the transfer device 8 between any one of the carriers 3 mounted on the carrier mounting unit 4 and the substrate delivery table 10.

(Substrate Processing Chamber)

Further, the substrate processing chamber 6 includes a substrate transfer unit 13 extended in a forward/backward direction at a central portion thereof, and multiple plating apparatuses 20 arranged at one side and the other side of the substrate transfer unit 13 in the forward/backward direction and configured to perform a plating process by supplying a plating liquid to the substrates 2.

The substrate transfer unit 13 includes a substrate transfer device 14 configured to be moved in the forward/backward direction. Further, the substrate transfer unit 13 communicates with the substrate delivery table 10 in the substrate delivery chamber 11 via a substrate loading/unloading opening 15.

In the substrate processing chamber 6, the substrates 2 are transferred one by one to the plating apparatuses 20 by the substrate transfer device 14 of the substrate transfer unit 13 while each of the substrates 2 is horizontally held. Further, in the plating apparatuses 20, a cleaning process and a plating process are performed on the substrates 2 one by one.

The plating apparatuses 20 have substantially the same configuration except plating liquids used therein. Therefore, hereinafter, a configuration of one of the multiple plating apparatuses 20 will be explained.

Plating Apparatus

Figure 2:
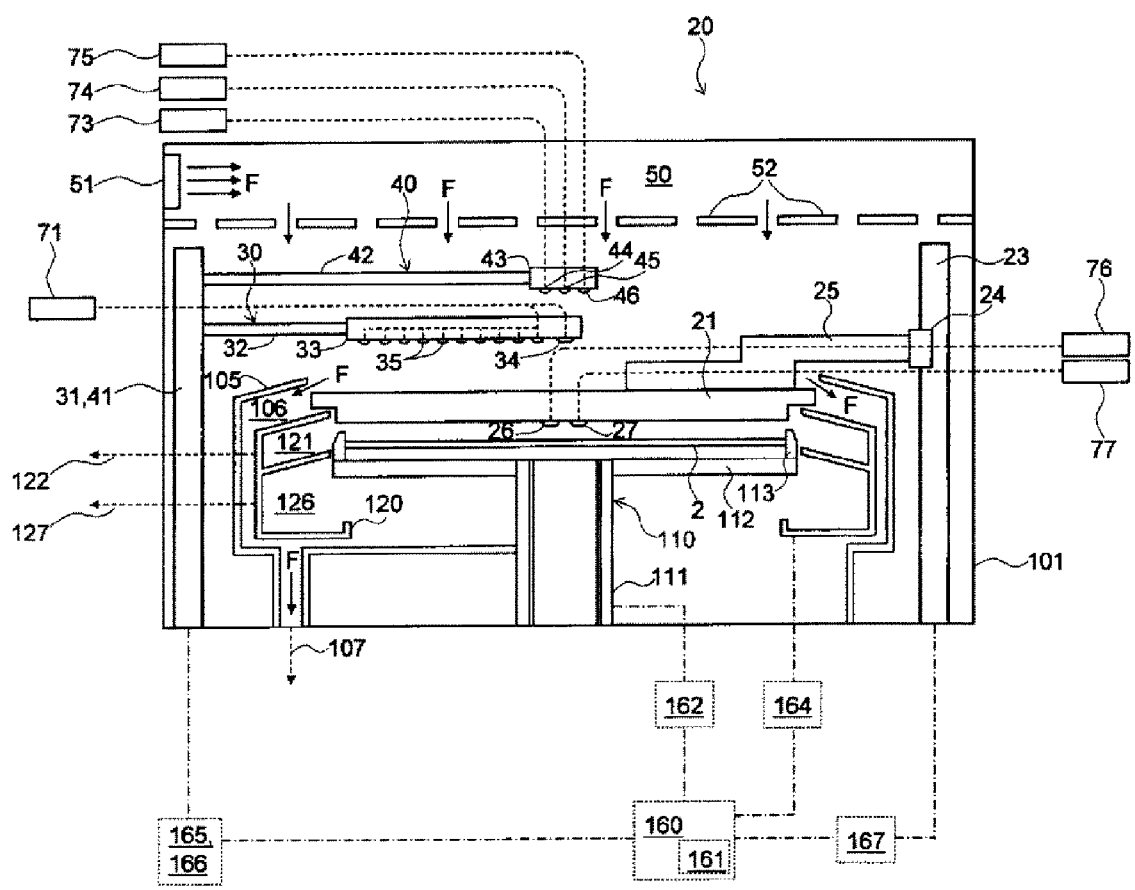
FIG. 2 is a side view showing a plating apparatus in accordance with the example embodiment.
Figure 3A:
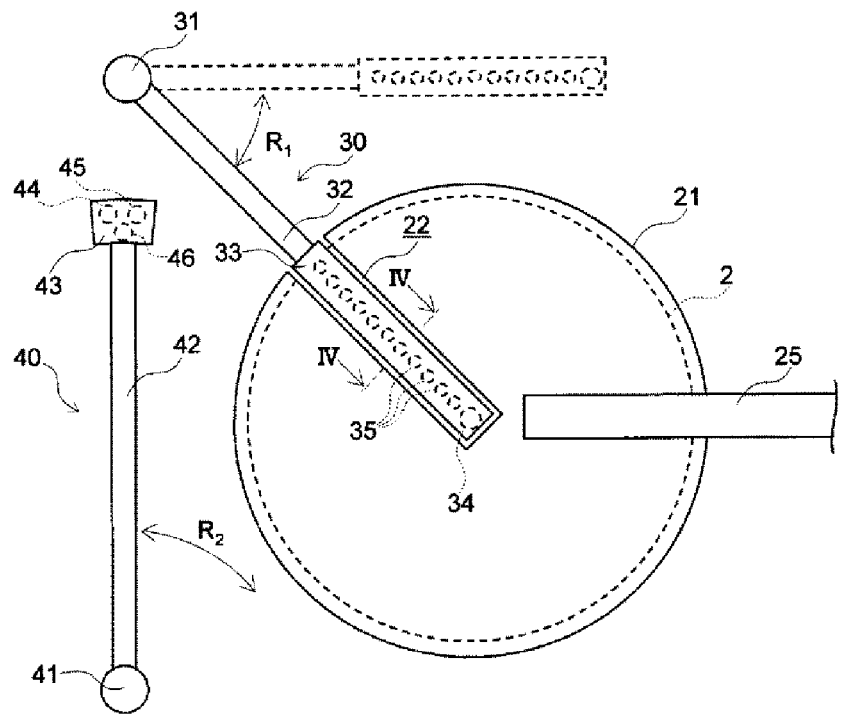
FIG. 3A and FIG. 3B are plane views of the plating apparatus illustrated in FIG. 2.
Figure 3B:
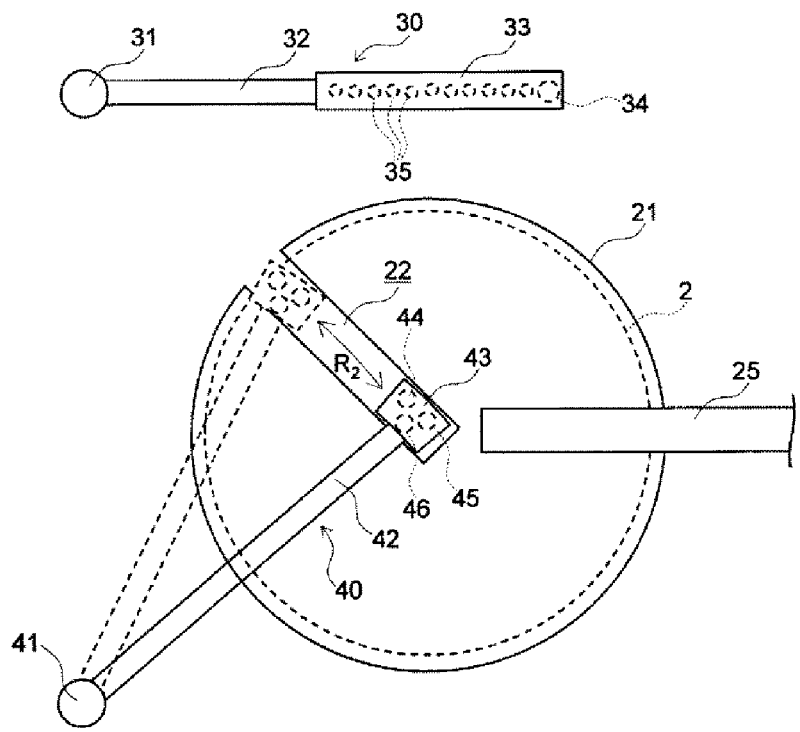

Hereinafter, referring to FIG. 2 to FIG. 3B, the plating apparatus 20 will be explained. FIG. 2 is a side view showing the plating apparatus 20, and FIG. 3A and FIG. 3B are plane views of the plating apparatus 20.

As depicted in FIG. 2, the plating apparatus 20 includes a substrate holding device 110 configured to hold and rotate the substrate 2 within a casing 101; a first discharge device 30 configured to discharge a plating liquid toward a surface of the substrate 2 held on the substrate holding device 110; a plating liquid supply device 71 connected to the first discharge device 30 and configured to supply the plating liquid to the first discharge device 30; and a top plate 21 provided above the substrate 2. The plating apparatus 20 may further include a second discharge device 40 configured to discharge the processing liquid toward the surface of the substrate 2.

Within the casing 101, there is provided a gas introduction unit 50 in which a gas such as a $N_2$ gas (nitrogen gas) or clean air is supplied from a FFU (fan filter unit) 51. The gas within the gas introduction unit 50 is transferred as a downflow toward the substrate 2 through a flow rectifying plate 52.

Around the substrate holding device 110, a liquid drain cup 120 including a first opening 121 and a second opening 126 configured to receive a liquid such as a plating liquid or a processing liquid scattered from the substrate 2 and a gas exhaust cup 105 including an opening 106 configured to suck a gas are arranged. The liquid received through the first opening 121 and the second opening 126 of the liquid drain cup 120 are drained out by a first liquid drain device 122 and a second liquid drain device 127, respectively. The gas sucked through the opening 106 of the gas exhaust cup 105 is exhausted by a gas exhaust device 107. Further, the liquid drain cup 120 is connected with an elevation device 164 configured to vertically move the liquid drain cup 120. Thus, by vertically moving the liquid drain cup 120 depending on a kind of a liquid scattered from the substrate 2, a liquid drain path may vary depending on a kind of a liquid.

(Substrate Holding Device)

As depicted in FIG. 2, the substrate holding device 110 includes a hollow cylindrical rotation shaft 111 vertically extended within the casing 101; a turn table 112 provided on an upper end of the rotation shaft 111; a wafer chuck 113 provided at an outer periphery portion of an upper surface of the turn table 112 and configured to support the substrate 2; and a rotation device 162 connected to the rotation shaft 111 and configured to rotate the rotation shaft 111.

The rotation device 162 is controlled to rotate the rotation shaft 111 by a control device 160. Thus, the substrate 2 supported by the wafer chuck 113 is rotated. In this case, the control device 160 controls the rotation device 162 to rotate the rotation shaft 111 and the wafer chuck 113 or stop the rotation thereof. Further, the control device 160 can increase or decrease the rotation number of the rotation shaft 111 and the wafer chuck 113, or can control the rotation number thereof to be maintained at a preset constant value.

(First Discharge Device)

Hereinafter, the first discharge device 30 will be explained. The first discharge device 30 includes a first discharge unit 33 configured to discharge a plating liquid toward the substrate 2. In the example as illustrated in FIG. 2, the first discharge unit 33 is configured as a discharge head in which a discharge opening for discharging the plating liquid toward the substrate 2 is formed. In this case, within the first discharge unit 33, a line for guiding the plating liquid supplied from the plating liquid supply device 71 to the discharge opening, or a line for circulating a heat transfer medium for keeping heat of the plating liquid is accommodated.

A kind of a plating liquid is not specifically limited, and various plating liquids may be discharged from the first discharge device 30. By way of example, a plating liquid containing CoWB (cobalt-tungsten-boron) or CoWP (cobalt-tungsten-phosphorous) may be used for forming a metal film on a surface of a substrate including a Cu wiring. Further, a plating liquid containing, for example, CoWB or Ta (tantalum) may be used for forming a barrier film on a surface of a substrate or a surface of a recess formed on the substrate before a Cu wiring is formed in order to suppress Cu from being diffused into an insulating film.

The first discharge unit 33 is configured to be vertically and horizontally moved. By way of example, the first discharge unit 33 is provided at a leading end of an arm 32, and the arm 32 is fixed to a supporting shaft 31 which can be vertically extended and can also be rotated by a rotation device 165. Through the rotation device 165 and the supporting shaft 31, the first discharge unit 33 can be moved between a discharge position where the plating liquid is discharged toward the substrate 2 and a standby position where the plating liquid is not discharged. The standby position may be, for example, a horizontally retreated position of the first discharge unit 33 with respect to the substrate 2.

The first discharge unit 33 includes a first discharge opening 34. The first discharge opening 34 is arranged such that the discharged plating liquid reaches a central portion of the substrate 2 when the first discharge unit 33 is positioned at the discharge position to be described below. The plating liquid reaching the central portion of the substrate 2 flows toward a periphery portion of the substrate 2 by a centrifugal force caused by the rotation of the substrate 2.

As depicted in FIG. 2, the first discharge unit 33 may be extended to have a length corresponding to a distance from the central portion of the substrate 2 to the periphery portion of the substrate 2, i.e., the radius of the substrate 2. In this case, the first discharge unit 33 may further include multiple second discharge openings 35 arranged along a preset direction in addition to the above-described first discharge opening 34. When the first discharge unit 33 is located at the discharge position, the second discharge openings 35 are arranged along a radial direction of the substrate 2. Therefore, it is possible to directly supply the plating liquid from each of the discharge openings 34 and 35 of the first discharge unit 33 to a preset portion ranging from the central portion of the substrate 2 to the periphery portion thereof. Herein, the term "directly supply" means that a path through which the plating liquid reaches the preset portion on the substrate 2 is not a path through which the plating liquid dripped on a further central portion of the substrate 2 than the preset portion reaches the preset portion by the centrifugal force caused by the rotation of the substrate 2, but a path through which the plating liquid is dripped on the preset portion.

In general, a temperature of the ambient atmosphere of the substrate 2 or a temperature of the substrate 2 is lower than a temperature of the plating liquid discharged from the first discharge unit 33. Therefore, it is assumed that when the plating liquid dripped on or near the central portion of the substrate 2 flows outwards on the substrate 2 by the centrifugal force, the temperature of the plating liquid decreases as the plating liquid flows toward the periphery portion of the substrate 2. Therefore, in the case of the plating process in which the plating liquid is dripped only on or near the central portion of the substrate 2 and then diffused to the entire substrate 2 by the centrifugal force, the temperature of the plating liquid on the substrate 2 may decrease as the plating liquid flows from the central portion of the substrate 2 to the periphery portion thereof.

Herein, if the first discharge unit 33 includes the multiple second discharge openings 35 as described above, the plating liquid can be directly supplied to a portion within a preset range in the radial direction of the substrate 2. Therefore, it is possible to suppress a difference between a temperature of the plating liquid reaching a peripheral portion of the substrate 2 than the central portion of the substrate 2 and a temperature of the plating liquid reaching the central portion of the substrate.

Further, in the example as depicted in FIG. 2, each of the discharge openings 34 and 35 is formed at leading ends of multiple nozzles protruding downwards from the discharge head of the first discharge unit 33. However, the configuration of the discharge openings 34 and 35 is not limited to the example as depicted in FIG. 2. By way of example, the nozzles protruding downwards as depicted in FIG. 2 may not be provided at the first discharge unit 33. By way of example, each of the discharge openings 34 and 35 may be configured as an opening formed at the discharge head of the first discharge unit 33. Further, a shape of each of the discharge openings 34 and 35 is not specifically limited, and a shape such as a round hole or a slit may be appropriately employed.

In particular, the discharge opening 35 of the first discharge unit 33 may have, for example, a slit opening extended along the radial direction of the substrate 2. In this case, even if the discharge opening 35 formed at the first discharge unit 33 is single or small in number, the plating liquid can be directly supplied to a portion within a preset range in the radial direction of the substrate 2.

(Second Discharge Device)

Hereinafter, the second discharge device 40 will be explained. The second discharge device 40 includes a second discharge unit 43 configured to discharge a processing liquid toward the substrate 2. The second discharge unit 43 is configured to be vertically and horizontally moved. By way of example, in the same manner as the first discharge unit 33, the second discharge unit 43 is provided at a leading end of an arm 42, and the arm 42 is fixed to a supporting shaft 41 which can be vertically extended and can also be rotated by a rotation device 166.

Like the first discharge unit 33, as depicted in FIG. 2, the second discharge unit 43 is configured as a discharge head in which a first discharge opening 44, a second discharge opening 45, and a third discharge opening 46 for discharging a liquid such as a processing liquid or a plating liquid toward the substrate 2. The processing liquid may include, for example, a rinse liquid such as DIW for performing a rinse process on the substrate 2, a cleaning liquid such as MEL for performing a cleaning process on the substrate 2, and a drying liquid such as IPA for performing a drying process on the substrate 2. The plating liquid may be the same as the plating liquid discharged from the first discharge device 30. A liquid discharged from each of the discharge openings 44, 45, and 46 is not particularly limited, and may be appropriately selected. By way of example, the first discharge opening 44 is connected with a rinse liquid supply device 73 configured to supply a rinse liquid, the second discharge opening 45 is connected with a plating liquid supply device 74 configured to supply a plating liquid, and the third discharge opening 46 is connected with a cleaning liquid supply device 75 configured to supply a cleaning liquid.

Further, as depicted in FIG. 2, each of the discharge openings 44, 45, and 46 is formed at leading ends of multiple nozzles protruding downwards from the discharge head of the second discharge unit 43 in the same manner as each of the discharge openings 34 and 35 of the first discharge unit 33. However, the configuration of the discharge openings 44, 45, and 46 is not limited to the example as depicted in FIG. 2. By way of example, the nozzles protruding downwards as depicted in FIG. 2 may not be provided at the second discharge unit 43. By way of example, each of the discharge openings 44, 45, and 46 may be configured as an opening formed at the discharge head of the second discharge unit 43.

(Top Plate)

Hereinafter, the top plate 21 will be explained. The top plate 21 is configured to suppress an ambient atmosphere of the substrate 2 from being diffused into the inside of the plating apparatus 20. By using the top plate 21, it is possible to suppress various substances contained in the ambient atmosphere of the substrate 2 from adhering to the constituent components of the plating apparatus 20, so that particles may not be generated. Further, as described below, it is possible to suppress an ambient gas of the substrate 2 from being flown, and, thus, it is possible to suppress heat in the ambient atmosphere of the substrate 2 from being lost to the outside.

The top plate 21 is configured to be vertically moved. By way of example, as depicted in FIG. 2, the top plate 21 is provided at one end of a supporting unit 25, and a moving part 24 is provided at the other end of the supporting unit 25. The moving part 24 is configured to be moved by a driving device 167 along a supporting shaft 23 vertically extended. Through the driving device 167, the supporting shaft 23, the moving part 24, and the supporting unit 25, a distance between the substrate 2 and the top plate 21 can be changed as necessary. By way of example, the top plate 21 can be moved among a first position where the top plate 21 is near the substrate 2, and a second position and a third position above the first position, which will be described later.

An opening 22 is formed on the top plate 21. Hereinafter, referring to FIG. 3A and FIG. 3B, the opening 22 of the top plate 21 will be explained. Each of FIG. 3A and FIG. 3B is a plane view illustrating the top plate 21, the first discharge device 30, and the second discharge device 40. Further, in FIG. 3A and FIG. 3B, the substrate 2 covered with the top plate 21 when viewed from above is indicated by a dotted line.

In FIG. 3A, the first discharge device 30 at the standby position described above is indicated by a dotted line, and the first discharge device 30 at the discharge position described above is indicated by a solid line. Further, in FIG. 3A, the second discharge device 40 is positioned at a standby position. As depicted in FIG. 3A, the opening 22 of the top plate 21 is extended from a central portion of the top plate 21 to an outer peripheral edge of the top plate 21. When positioned at the discharge position, the first discharge unit 33 of the first discharge device 30 is arranged to be overlapped with the opening 22 of the top plate 21. Herein, the term "arranged to be overlapped" means that the first discharge unit 33 is positioned such that a gas flow from above the top plate 21 to below the top plate 21 through the opening 22 is impeded. By way of example, FIG. 3A illustrates an example where the outline of the opening 22 of the top plate 21 is approximately identical with the outline of the first discharge unit 33 as viewed from a normal direction of the top plate 21.

Figure 4:
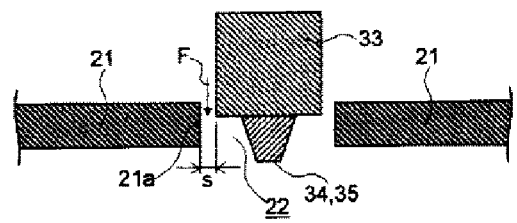
FIG. 4 is a cross-sectional view of a first discharge unit of a first discharge device and a top plate of FIG. 3A as viewed from a direction taken along a line IV-IV.

Referring to FIG. 4, a relationship between the opening 22 of the top plate 21 and the first discharge unit 33 will be explained. FIG. 4 is a cross-sectional view of the first discharge unit 33 and the top plate 21 of FIG. 3A as viewed from a direction taken along a line IV-IV. As depicted in FIG. 4, the first discharge unit 33 is configured to clog the opening 22 with a gap s between the first discharge unit 33 and an end portion 21a of the top plate 21. Thus, a width of a flow path for a gas passing through the opening 22 can be limited to the gap s. Therefore, when a gas passes through the opening 22, impedance can be increased. That is, a flow F of a gas in a space between the substrate 2 and the top plate 21 can be suppressed. Thus, it is possible to suppress heat accumulated in the substrate 2, in the plating liquid on the substrate 2, or in the space between the substrate 2 and the top plate 21 from being lost to the outside. Therefore, it is possible to efficiently suppress the temperature of the plating liquid discharged toward the substrate 2 from being decreased.

A value of the gap s between the top plate 21 and the first discharge unit 33 is not particularly limited and can be appropriately set. By way of example, the gap s may be in a range of from about 0.3 mm to about 3.0 mm.

A material of the top plate 21 is not particularly limited and may include, for example, a ceramic material or a metallic material such as aluminum.

Desirably, the top plate 21 is configured to be moved toward the substrate 2 without being interfered with the first discharge unit 33. By way of example, the first discharge unit 33 is configured to be inserted through the opening 22 from above. In this case, a downward movement of the top plate 21 is not impeded by the first discharge unit 33. For this reason, the top plate 21 can approach the substrate 2 without limitation. Therefore, a distance between the top plate 21 and the substrate 2 can be decreased as compared with a case where the first discharge unit 33 is provided below the top plate 21. Thus, is possible to further suppress heat accumulated in the substrate 2, in the plating liquid on the substrate 2, or in the space between the substrate 2 and the top plate 21 from being lost to the outside.

Figure 5A:
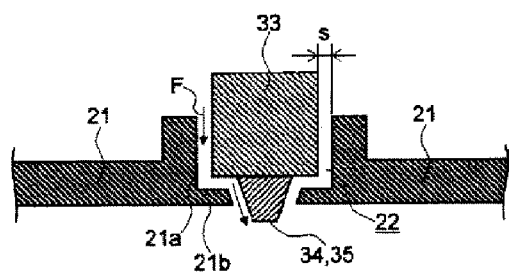
FIG. 5A to FIG. 5D illustrate modification examples of the first discharge unit and the top plate.
Figure 5B:
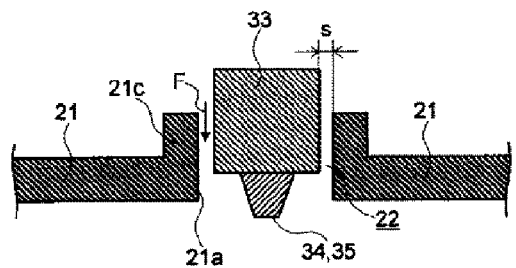
Figure 5C:
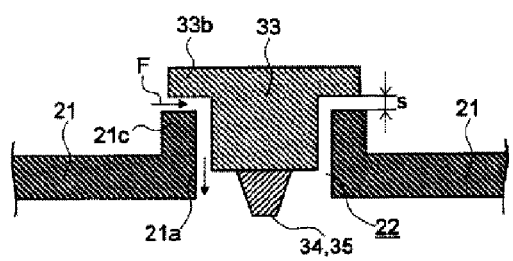
Figure 5D:
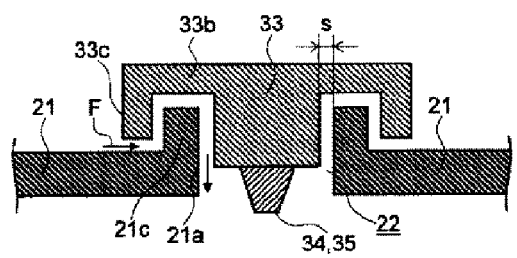

Further, the relationship between the opening 22 of the top plate 21 and the first discharge unit 33 is not limited to the example as depicted in FIG. 4, and various modification examples can be made. By way of example, as depicted in FIG. 5A, a side protrusion 21b horizontally protruding toward the first discharge 33 may be formed at the end portion 21a of the top plate 21. Further, as depicted in FIG. 5B, an upward protrusion 21c upwardly protruding may be formed at the end portion 21a of the top plate 21. Furthermore, as depicted in FIG. 5C, a side protrusion 33b horizontally protruding may be formed along an upper surface of the upward protrusion 21c of the top plate 21. Moreover, as depicted in FIG. 5D, a downward protrusion 33c protruding downwards from the side protrusion 33b toward the top plate 21 may be further formed at the first discharge unit 33 along a side surface of the upward protrusion 21c. Further, the gap s between the top plate 21 and the first discharge unit 33 may form all or a part of the flow path for a gas reaching the ambient atmosphere of the substrate 2. By employing these modification examples, it is possible to further increase impedance when a gas passes through the opening 22.

Further, FIG. 4 and FIG. 5A to FIG. 5D illustrate the example where the gap s is formed between the top plate 21 and the first discharge unit 33. That is, there is shown the example where the top plate 21 is not in contact with the first discharge unit 33. However, the example embodiment is not limited thereto. When the opening 22 is clogged with the first discharge unit 33, the top plate 21 may be in contact with the first discharge unit 33. Thus, the opening 22 can be further firmly clogged. Further, if the top plate 21 is not in contact with the first discharge unit 33, the risk that any particle can be generated by the contact therebetween so that the substrate 2 can be contaminated can be removed.

Hereinafter, referring to FIG. 3B, a positional relationship between the opening 22 of the top plate 21 and the second discharge device 40 will be explained. FIG. 3B illustrates a diagram that the second discharge unit 43 is rotated about the supporting shaft 41 as a rotational shaft in a rotation direction $R_2$. The second discharge unit 43 of the second discharge device 40 is configured to allow a sufficient gas to flow from above the top plate 21 to below the top plate 21 through the opening 22 even when the second discharge unit 43 is positioned at the discharge position. By way of example, as depicted in FIG. 3B, the outline of the second discharge unit 43 is sufficiently smaller than the outline of the opening 22 of the top plate 21 when viewed from a normal direction of the top plate 21.

Desirably, the second discharge device 40 is configured to allow the second discharge unit 43 to move above the opening 22 of the top plate 21 when the second discharge unit 43 horizontally moves in the rotation direction $R_2$. Thus, when the top plate 21 is below the arm 42 of the second discharge device 40, a processing liquid or a plating liquid can be discharged from the second discharge unit 43 toward the substrate 2 while the second discharge unit 43 is horizontally driven.

Figure 6:
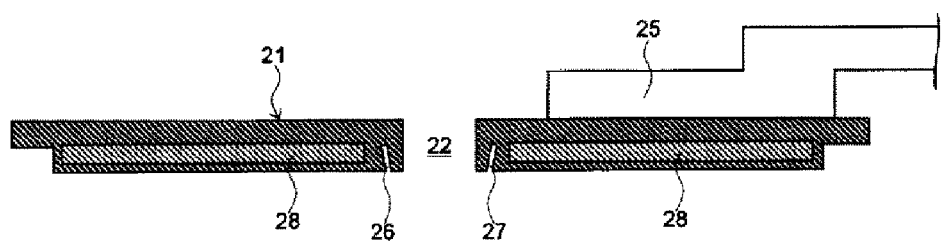
FIG. 6 is a cross-sectional view showing the top plate in accordance with the example embodiment.

Hereinafter, referring to FIG. 2 and FIG. 6, a configuration of the top plate 21 will be explained in more detail. As depicted in FIG. 2 and FIG. 6, a first discharge opening 26 and a second discharge opening 27 configured to discharge a processing liquid, a plating liquid, or a processing fluid toward the substrate 2 may be formed at the top plate 21. The processing liquid may include a rinse liquid such as DIW for performing a rinse process on the substrate 2, a cleaning liquid such as MEL for performing a cleaning process on the substrate 2, and a drying liquid such as IPA for performing a drying process on the substrate 2. The plating liquid may be the same as the plating liquid discharged from the first discharge device 30. The processing fluid may include a $N_2$ gas or dry air for drying the substrate 2. By way of example, as depicted in FIG. 2, the first discharge opening 26 is connected with a plating liquid supply device 76 configured to supply a plating liquid, and the second discharge opening 27 is connected with an air supply device 77 configured to supply dry air.

As depicted in FIG. 6, a heater 28 may be provided at the top plate 21. The heater 28 may be configured to heat the space between the top plate 21 and the substrate 2. The heater 28 may include, for example, a heater using heat generated by applying an electric current to a resistor, or a heater configured to circulate a heat transfer medium supplied from the outside within or near the top plate 21. Further, the heater 28 may be configured to heat the substrate 2 to heat a plating liquid on the substrate 2 or a gas in the space between the top plate 21 and the substrate 2. Examples of the heater 28 may include an infrared heater or a LED heater.

With the heater 28, the atmosphere between the top plate 21 and the substrate 2 can be controlled to have a higher temperature, so that the plating liquid on the substrate 2 can also be controlled to have a higher temperature. Therefore, it is possible to further suppress a temperature of the plating liquid 37 discharged toward the substrate 2 from being decreased.

An operation of the plating system 1 including the multiple plating apparatuses 20 configured as described above is controlled by the control device 160 according to various programs recorded in a storage medium 161 provided in the control device 160. Thus, various processes are performed on the substrate 2. Herein, the storage medium 161 is configured to store various set data or various programs such as a plating process program to be described later. As the storage medium 161, a well-known storage medium such as a computer-readable memory, e.g., a ROM or a RAM, or a hard disc, a disc-shaped storage medium, e.g., a CD-ROM, a DVD-ROM, or a flexible disc may be used.

Plating Method

In the present example embodiment, the plating system 1 and the plating apparatuses 20 are controlled to perform a plating process on the substrate 2 according to the plating process program stored in the storage medium 161. Hereinafter, referring to FIG. 7A to FIG. 7H and FIG. 8, there will be explained a method of discharging a CoWB plating liquid toward the substrate 2 and forming a CoWB plating layer on the surface of the substrate 2 in the plating apparatus 20. In FIG. 7A to 7H, FIG. 7A, FIG. 7C, FIG. 7E, and FIG. 7G provide side views of the top plate 21 or the discharge devices 30 and 40, and FIG. 7B, FIG. 7D, FIG. 7F, and FIG. 7H provide top views of the top plate 21 or the discharge devices 30 and 40.

(Substrate Holding Process)

The single substrate 2 is loaded into the plating apparatus 20 from the substrate delivery chamber 11 by the substrate transfer device 14 of the substrate transfer unit 13.

Figure 7A:
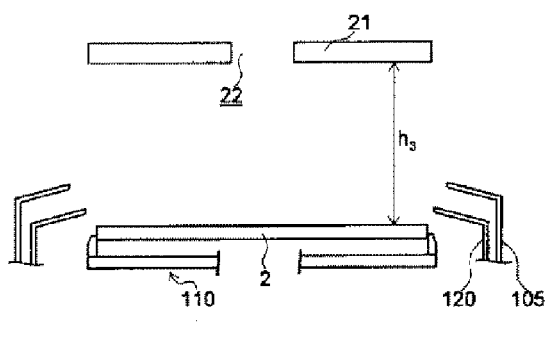
FIG. 7A and FIG. 7B illustrate a process of holding a substrate by a substrate holding device.
Figure 7B:
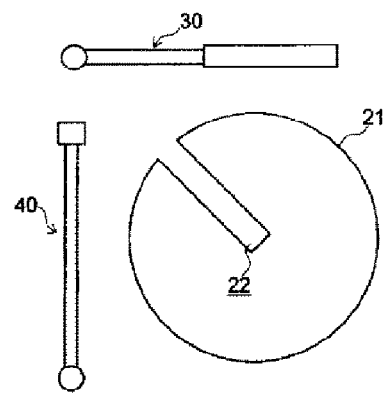

In the plating apparatus 20, the liquid drain cup 120 is moved down to a preset position, and then, the loaded substrate 2 is held on the wafer chuck 113 of the substrate holding device 110. Herein, as depicted in FIG. 7A, the top plate 21 is raised upwards to the third position by the driving device 167. At the third position, a distance $h_3$ between the substrate 2 and the top plate 21 is set to be, for example, about 80 mm. Then, the liquid drain cup 120 is raised up by the elevation device 164 to a position where the second opening 126 of the liquid drain cup 120 faces the outer peripheral edge of the substrate 2. Herein, as depicted in FIG. 7B, each of the first discharge device 30 and the second discharge device 40 is arranged at the standby position.

A gas such as clean air is supplied as a downflow from the gas introduction unit 50, and then, this gas is exhausted by the exhaust device 107 through the gas exhaust cup 105. Thus, it is possible to continuously substitute the atmosphere within the plating apparatus 20 to secure safety in the plating apparatus 20.

(Pre-Wet Process)

Figure 7C:
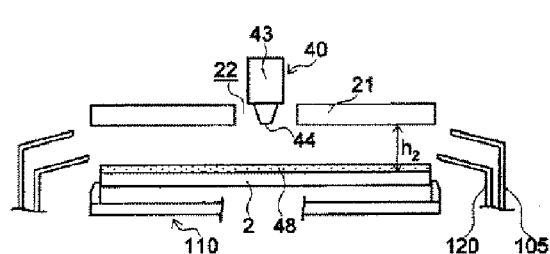
FIG. 7C and FIG. 7D illustrate a pre-wet process.
Figure 7D:
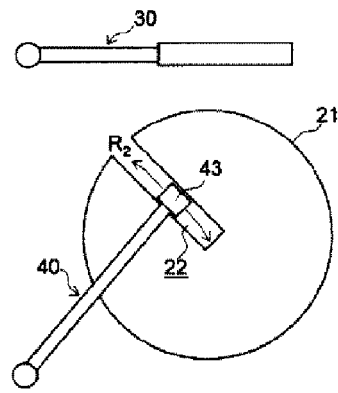

Then, before a plating process, a so-called "pre-wet process" of discharging a rinse liquid such as DIW toward the substrate 2 is performed. In this case, as depicted in FIG. 7C, the top plate 21 is lowered to the second position lower than the third position by the driving device 167. At the second position, a distance $h_2$ between the substrate 2 and the top plate 21 is set to be, for example, about 20 mm. Then, the substrate 2 is rotated by the substrate holding device 110, and as depicted in FIG. 7D, the second discharge unit 43 of the second discharge device 40 is horizontally moved from the standby position to the discharge position along the rotation direction $R_2$. Thereafter, while the second discharge unit 43 is horizontally moved from the central portion of the substrate 2 to the periphery portion of the substrate 2 or the second discharge unit 43 is horizontally moved from the periphery portion of the substrate 2 to the central portion of the substrate 2, the rinse liquid 48 is discharged from the first discharge opening 44 of the second discharge unit 43 toward the surface of the substrate 2. The rinse liquid 48 scattered from the substrate 2 is drained out by the second liquid drain device 127 through the second opening 126 of the liquid drain cup 120.

Figure 8:
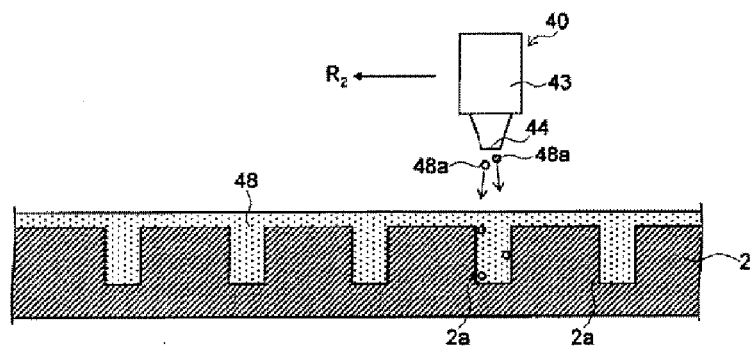
FIG. 8 illustrates a diagram that a rinse liquid is discharged from a first discharge opening.

FIG. 8 illustrates liquid droplets 48*a* of the rinse liquid 48 discharged from the first discharge opening 44 toward the substrate 2 in the pre-wet process. In the present process, the second discharge unit 43 is horizontally moved while discharging the liquid droplets 48*a* of the rinse liquid 48, as described above. Therefore, the liquid droplets 48*a* discharged from the first discharge opening 44 directly reach a recess 2*a* of the substrate 2.

Otherwise, the physical energy caused by the kinetic energy of the liquid droplets 48*a* is transferred to the recess 2*a* of the substrate 2. Therefore, as compared with the conventional case where the rinse liquid 48 reaches each of the recesses 2*a* only by the centrifugal force caused by the rotation of the substrate 2, the rinse liquid 48 can be thoroughly diffused throughout the recesses 2*a*.

(Plating Process)

Hereinafter, a plating process of discharging a plating liquid from the first discharge device 30 toward the substrate 2 is performed. Desirably, this plating process is started while the rinse liquid 48 remains on the substrate 2. By performing the plating process while the substrate 2 is not dried, it is possible to avoid a problem that a plating process may not be favorably performed on a plating target surface of the substrate 2 since the plating target surface of the substrate 2 is oxidized.

Figure 7E:
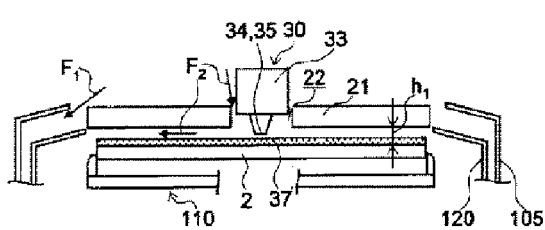
FIG. 7E and FIG. 7F illustrate a plating process.
Figure 7F:
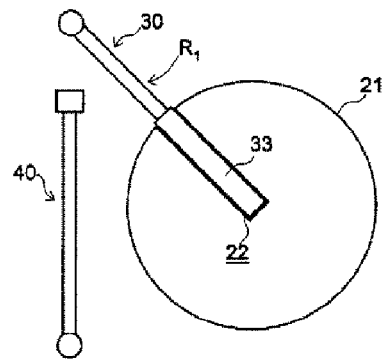

In the plating process, as depicted in FIG. 7E, the top plate 21 is lowered to the first position lower than the second position by the driving device 167. At the first position, a distance $h_1$ between the substrate 2 and the top plate 21 is set to be, for example, about 10 mm. Further, the first discharge unit 33 of the first discharge device 30 is moved to the discharge position where the opening 22 can be clogged with the first discharge unit 33. By way of example, the first discharge unit 33 is raised from the standby position, and then, as depicted in FIG. 7F, the first discharge unit 33 is horizontally moved along a rotation direction $R_1$ until the first discharge unit 33 is overlapped with the opening 22. Thereafter, as depicted in FIG. 7E, the first discharge unit 33 and the discharge openings 34 and 35 are lowered through the opening 22 of the top plate 21. Further, the liquid drain cup 120 is raised by the elevation device 164 to a position where the first opening 121 of the liquid drain cup 120 faces the outer periphery of the substrate 2. Furthermore, positions of the leading ends of the discharge openings 34 and 35 are not particularly limited and can be appropriately selected. By way of example, the positions of the leading ends of the discharge openings 34 and 35 may be lower or higher than a position of a lower surface of the top plate 21.

Then, the plating liquid 37 is discharged from the opening 22 of the top plate 21 toward the substrate 2. In this case, a temperature of the plating liquid 37 is appropriately adjusted by the plating liquid supply device 71. By way of example, if a CoWB plating liquid is used as the plating liquid 37, a temperature of the plating liquid 37 is adjusted in a range of from 60° C. to 80° C. The plating liquid 37 scattered from the substrate 2 is drained out by the first liquid drain device 122 through the first opening 121 of the liquid drain cup 120.

Further, the expression "the plating liquid 37 is discharged from the opening 22" means that a path through which the plating liquid 37 reaches the substrate 2 is a path for the plating liquid 37 to pass through the opening 22. By way of example, as depicted in FIG. 7E, after the plating liquid 37 is supplied to the first discharge unit 33 from the plating liquid supply device 71, the plating liquid 37 passes through the opening 22 until the plating liquid 37 reaches the discharge openings 34 and 35 via lines within the first discharge unit 33. Further, if the plating liquid 37 is discharged from each of the discharge openings 34 and 35 while each of the discharge openings 34 and 35 of the first discharge unit 33 is positioned above the opening 22 unlike the case as depicted in FIG. 7E, the plating liquid 37 discharged from each of the discharge openings 34 and 35 passes through the opening 22 until the plating liquid 37 reaches the substrate 2.

Herein, in accordance with the present example embodiment, as described above, the first discharge unit 33 is configured and arranged to be overlapped with the opening 22 of the top plate 21. Therefore, impedance (impedance on a path indicated by an arrow $F_2$ in FIG. 7E) when a gas passes through the opening 22 of the top plate 21 can be greater than impedance (impedance on a path indicated by an arrow $F_1$ in FIG. 7E) when a gas passes through the vicinity of the outer peripheral edge of the top plate 21. As a result, a path for a gas exhausted by the exhaust device 107 when passing through the vicinity of the top plate 21 is mainly the path indicated by the arrow $F_1$. Thus, while the atmosphere within the plating apparatus 20 is continuously substituted, a flow of a gas flowing from the opening 22 of the top plate 21 toward the substrate 2 can be impeded or suppressed, and, thus, a flow of a gas in the space between the substrate 2 and the top plate 21 can also be impeded or suppressed. Accordingly, it is possible to suppress heat accumulated in the substrate 2, in the plating liquid on the substrate 2, or in the space between the substrate 2 and the top plate 21 from being lost to the outside. Therefore, it is possible to efficiently suppress a decrease in the temperature of the plating liquid discharged toward the substrate 2. Thus, a temperature distribution of the plating liquid 37 on the substrate 2 can be substantially uniform regardless of positions thereon. Therefore, the plating layer can be uniformly grown within the substrate 2.

Desirably, while the plating liquid 37 is discharged from the discharge openings 34 and 35 toward the substrate 2, the space between the top plate 21 and the substrate 2 or the substrate 2 is heated by the heater 28 provided at the top plate 21. Thus, the plating liquid 37 on the substrate 2 can be maintained at a higher temperature. Therefore, a temperature distribution of the plating liquid 37 on the substrate 2 can be more uniform.

(Rinse Process)

Figure 7G:
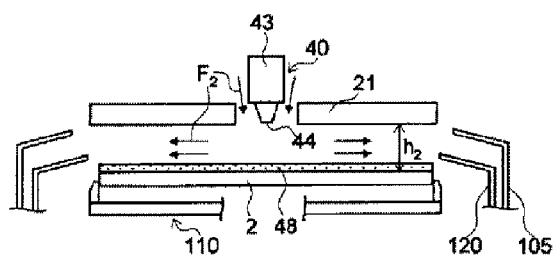
FIG. 7G and FIG. 7H illustrate a rinse process.
Figure 7H:
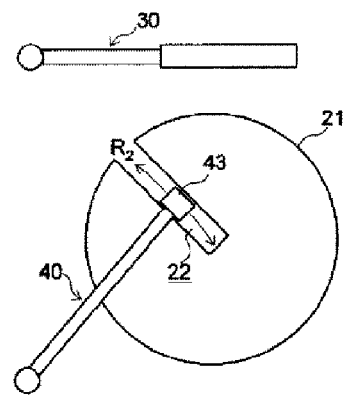

Then, a rinse process of supplying a rinse liquid such as DIW toward the substrate 2 is performed. In this case, as depicted in FIG. 7G, the top plate 21 is raised to the second position by the driving device 167. Further, the liquid drain cup 120 is raised to the position where the second opening 126 of the liquid drain cup 120 faces the outer periphery of the substrate 2. Thereafter, the rinse liquid 48 is discharged toward the substrate 2 from the first discharge opening 44. Herein, desirably, as depicted in FIG. 7H, while the second discharge unit 43 is horizontally moved from the central portion of the substrate 2 toward the periphery portion of the substrate 2 or the second discharge unit 43 is horizontally moved from the periphery portion of the substrate 2 toward the central portion of the substrate 2, the rinse liquid 48 is discharged from the first discharge opening 44 of the second discharge unit 43 toward the surface of the substrate 2. Thus, the rinse liquid 48 can be thoroughly diffused throughout the recesses 2a. The rinse liquid 48 scattered from the substrate 2 is drained out by the second liquid drain device 127 through the second opening 126 of the liquid drain cup 120.

Herein, in accordance with the present example embodiment, the opening 22 is formed on the top plate 21, and the outline of the second discharge unit 43 of the second discharge device 40 is sufficiently smaller than the outline of the opening 22 of the top plate 21. Therefore, as depicted in FIG. 7G, when a gas passes through the opening 22 of the top plate 21, impedance can be decreased. Further, the top plate 21 is positioned at the second position above the first position during the plating process, so that impedance can be decreased when a gas passes through the space between the substrate 2 and the top plate 21. Therefore, in the rinse process, a sufficient flow rate of a gas flowing from the central portion of the substrate 2 toward the periphery portion of the substrate 2 in the space between the substrate 2 and the top plate 21 can be obtained as compared with the plating process. A flow rate of a gas passing through the opening 22 of the top plate 21 during the rinse process is higher than at least a flow rate of a gas passing through the opening 22 of the top plate 21 during the plating process. As a result, the substrate 2 and the ambient atmosphere of the substrate 2 can be maintained clean. By way of example, by forming a flow of a gas on the substrate 2, it is possible to suppress the liquid, which is collided with the liquid drain cup 120 or the gas exhaust cup 105 after being scattered from the substrate 2, from adhering again to the substrate 2. Thus, it is possible to suppress impurities such as particles from being deposited on the substrate 2.

Desirably, the rinse process is started while the plating liquid 37 remains on the substrate 2. Since the rinse process is started while the substrate 2 is not dried as such, a high-quality plating layer can be obtained.

(Drying Process)

Then, a drying process of discharging a drying liquid such as IPA toward the substrate 2 is performed. By way of example, while the second discharge unit 43 is horizontally moved from the central portion of the substrate 2 toward the periphery portion of the substrate 2 or the second discharge unit 43 is horizontally moved from the periphery portion of the substrate 2 toward the central portion of the substrate 2, IPA is discharged from the third discharge opening 46 of the second discharge unit 43 toward the surface of the substrate 2. Herein, dry air may be discharged from the second discharge opening 27 formed at the top plate 21 toward the substrate 2. Thus, the drying process of the substrate 2 can be accelerated. Further, in the drying process, the top plate 21 may be positioned at the second position or at the other positions such as the third position.

Then, the substrate 2 is unloaded from the plating apparatus 20 by the substrate transfer device 14 of the substrate transfer unit 13. The unloaded substrate 2 may be transferred into another plating apparatus 20 to perform an additional process.

As such, in accordance with the present example embodiment, the opening 22 is formed at the top plate 21 provided above the substrate 2. Further, in the plating process, the plating liquid 37 is discharged from the opening 22 of the top plate 21 toward the substrate 2. Therefore, the first discharge unit 33 of the first discharge device 30 may be overlapped with the opening 22 of the top plate 21 at the discharge position. For this reason, during the plating process, it is possible to suppress heat accumulated in or around the substrate 2 from being lost to the outside, and, thus, it is possible to efficiently suppress a decrease in the temperature of the plating liquid discharged toward the substrate 2.

Further, in accordance with the present example embodiment, since it is possible to suppress the heat from being lost to the outside, an amount of heat to be supplied to or around the substrate 2 per unit time can be reduced. By way of example, an amount of heat supplied from the plating liquid 37 can be reduced, so that an amount of the plating liquid 37 to be discharged toward the substrate 2 per unit time can also be reduced. As a result, a length of the first discharge unit 33 of the first discharge device 30 can be shortened as compared with the conventional case. By way of example, as described above, it is possible to obtain a required amount of heat from the plating liquid 37 discharged from the first discharge unit 33 having a length corresponding to the radius of the substrate 2 rather than the diameter of the substrate 2. Thus, an amount of the plating liquid 37 to be consumed can be reduced, and the manufacturing cost can be reduced accordingly. Further, since the length of the first discharge unit 33 is shortened, the opening 22 of the top plate 21 formed to correspond to the first discharge unit 33 can be reduced in size. Thus, it is possible to generate an improved synergy effect that further increases impedance when a gas passes through the opening 22.

Further, in accordance with the present example embodiment, the outline of the second discharge unit 43 including the first discharge opening 44 through which the rinse liquid 48 is discharged is sufficiently smaller than the outline of the opening 22 of the top plate 21. Therefore, in the other processes excluding the plating process, such as the rinse process, a sufficient flow rate of a gas flowing from the central portion of the substrate 2 toward the periphery portion of the substrate 2 can be obtained. As a result, the substrate 2 and the ambient atmosphere of the substrate 2 can be maintained clean. As such, in accordance with the present example embodiment, by forming the opening 22 of the top plate 21 and appropriately setting the shape of the first discharge unit 33 to be used in the plating process and the shape of the second discharge unit 43 to be used in the rinse process, it is possible to obtain both the heat keeping property in the plating process and the atmosphere substitution property in the rinse process.

Modification Example

Hereinafter, modification examples of the present example embodiment will be explained.

Figure 9A:
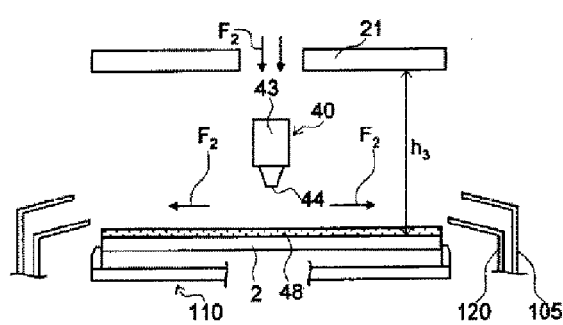
FIG. 9A and FIG. 9B illustrate a modification example of the plating process.
Figure 9B:
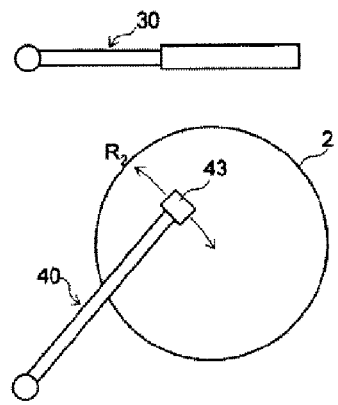

The above-described example embodiment illustrates the case where the top plate 21 is positioned at the second position during the rinse process, but is not limited thereto. As depicted in FIG. 9A and FIG. 9B, during the rinse process, the top plate 21 may be positioned at the third position above the second position. Thus, the impedance when a gas passes through the opening 22 of the top plate 21 can be further decreased. Thus, the substrate 2 or the ambient atmosphere of the substrate 2 can be maintained cleaner.

Figure 10A:
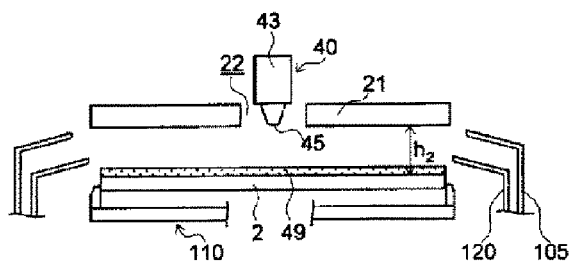
FIG. 10A and FIG. 10B illustrate a modification example of the plating process.
Figure 10B:
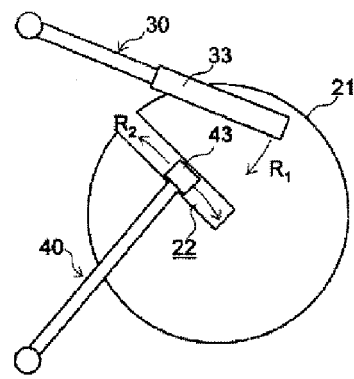

Further, the above-describe example embodiment illustrates the case where the plating liquid 37 is discharged from the first discharge device 30 toward the substrate 2 after the pre-wet process, but is not limited thereto. As depicted in FIG. 10A and FIG. 10B, before the plating liquid 37 is discharged from the first discharge device 30, as a first plating process, a plating liquid 49 may be discharged from the second discharge opening 45 of the second discharge device 40 toward the substrate 2. Herein, all of the second discharge opening 45 and the first discharge opening 44 used in the pre-wet process are formed at the second discharge unit 43. For this reason, while the rinse liquid 48 remains on the substrate 2, the discharging of the plating liquid 49 toward the substrate 2 can be easily started. In this case, as depicted in FIG. 10B, the plating liquid 49 may be discharged while the second discharge unit 43 is horizontally moved. Otherwise, as depicted in FIG. 10B, the first discharge unit 33 of the first discharge device 30 may be moved toward the opening 22 along the rotation direction $R_1$ while the plating liquid 49 is discharged from the first discharge opening 44 formed at the second discharge unit 43. Then, as a second plating process, the process of discharging the plating liquid 37 toward the substrate 2 from the discharge openings 34 and 35 of the first discharge device 30 is performed.

In the first plating process, a position of the top plate 21 is not particularly limited. By way of example, as depicted in FIG. 10A, the top plate 21 may be positioned at the second position during the pre-wet process, or although not illustrated, the top plate 21 may be positioned at the first position.

Figure 11A:
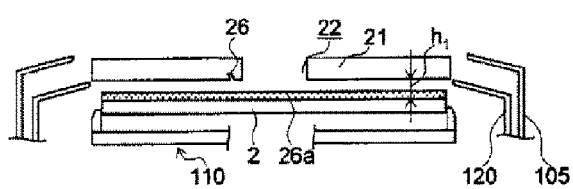
FIG. 11A and FIG. 11B illustrate a modification example of the rinse process.
Figure 11B:
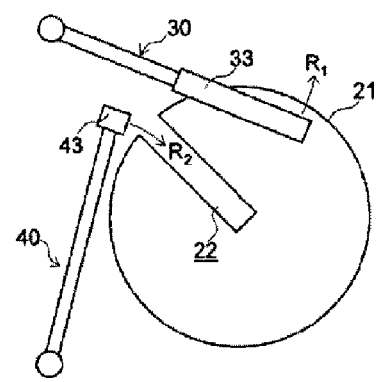

Furthermore, the above-described example embodiment illustrates the case where the rinse liquid 48 is discharged from the second discharge device 40 toward the substrate 2 after the plating process, but is not limited thereto. As depicted in FIG. 11A and FIG. 11B, before the rinse liquid 48 is discharged from the second discharge device 40, as a first rinse process, a rinse liquid 26a may be discharged from the first discharge opening 26 formed at the top plate 21 toward the substrate 2. Thus, while the plating liquid 37 remains on the substrate 2, the discharging of the rinse liquid 26a toward the substrate 2 can be easily started. In this case, depicted in FIG. 11B, the second discharge unit 43 of the second discharge device 40 may be moved toward the opening 22 along the rotation direction $R_2$ while the rinse liquid 26a is discharged from the first discharge opening 26 formed at the top plate 21. Then, as a second rinse process, the process of discharging the rinse liquid 48 toward the substrate 2 from the first discharge opening 44 of the second discharge device 40 is performed.

In the above-described first rinse process, a position of the top plate 21 is not particularly limited. By way of example, as depicted in FIG. 11A, the top plate 21 may be positioned at the first position during the plating process, or although not illustrated, the top plate 21 may be positioned at the second position or at the third position.

Figure 12A:
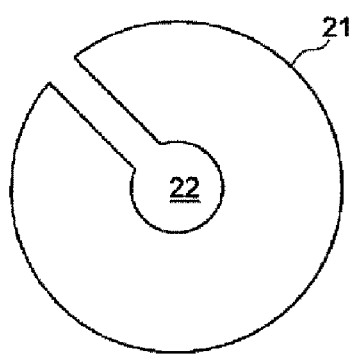
FIG. 12A to FIG. 12C illustrate modification examples of an opening formed on the top plate.
Figure 12B:
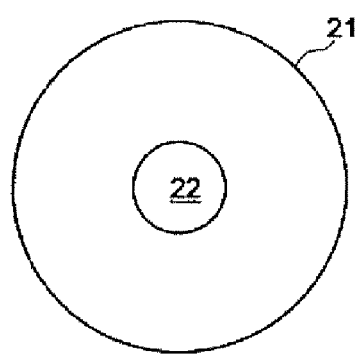
Figure 12C:
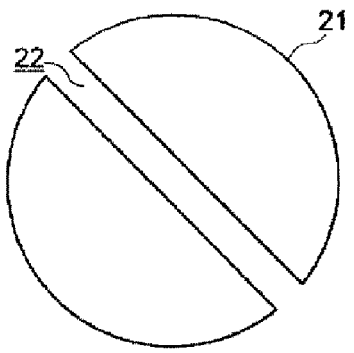

The above-described example embodiment illustrates the case where the opening 22 of the top plate 21 is formed to extend from the central portion of the top plate 21 to the outer peripheral edge of the top plate 21, but is not limited thereto. The shape of the opening 22 may be selected from various shapes depending on the amount of the plating liquid required per unit time, or the required heat keeping property. By way of example, as depicted in FIG. 12A, a width of the opening 22 may be greater at a region corresponding to the central portion of the substrate 2 than at a region corresponding to the periphery portion of the substrate 2. Thus, the discharge amount of the plating liquid toward the central portion of the substrate 2 can be further increased. Further, the opening 22 is extended to the outer peripheral edge of the top plate 21, or as depicted in FIG. 12B, the opening 22 may be formed only at the central portion of the top plate 21. Furthermore, as depicted in FIG. 12C, the opening 22 may be extended from one outer peripheral edge of the top plate 21 to the other outer peripheral edge thereof. In any case, the first discharge unit 33 of the first discharge device 30 is configured to be overlapped with the opening 22 of the top plate 21 at the discharge position.

Further, other processes, which are not explained in the above-described example embodiment, may be further performed. By way of example, after the rinse process and before the drying process, a cleaning process of discharging a cleaning liquid toward the substrate 2, so-called "post-cleaning process", may be further performed. By way of example, the cleaning liquid may be discharged from the third discharge opening 46 of the second discharge device 40 toward the substrate 2. Further, the same cleaning process may be performed as a so-called "pre-cleaning process" before the plating process.

Furthermore, although in the above-described example embodiment, while the second discharge unit 43 is horizontally moved from the central portion of the substrate 2 toward the periphery portion of the substrate 2 or the second discharge unit 43 is horizontally moved from the periphery portion of the substrate 2 toward the central portion of the substrate 2, the IPA is discharged from the third discharge opening 46 of the second discharge unit 43 toward the surface of the substrate 2, but it is not limited thereto. When the second discharge unit 43 is moved to an approximately central portion of the substrate 2 and then stopped, the IPA may be discharged through the third discharge opening 46 of the second discharge unit 43 from the approximately central portion of the substrate 2 toward the surface thereof.

Moreover, the above-described example embodiment illustrates the case where the first discharge unit 33 is configured as a discharge head in which the discharge opening is formed and a line for guiding the plating liquid to the discharge opening is provided. However, as long as the first discharge unit 33 is configured to be overlapped with the opening 22 of the top plate 21 at the discharge position, a detailed configuration of the first discharge unit 33 is not particularly limited. By way of example, the first discharge unit 33 may be configured as a discharge nozzle including a line through which the plating liquid passes and a discharge opening connected to the line. A detailed configuration of the second discharge unit 43 is also not particularly limited.

Although the example embodiment and several modification examples have been explained above, it is also possible to appropriately combine and apply multiple modification examples.

EXPLANATION OF REFERENCE NUMERALS

2: Substrate
20: Plating apparatus
21: Top plate
22: Opening
30: First discharge device
33: First discharge unit
110: Substrate holding device

We claim:

1. A plating apparatus of performing a plating process by supplying a plating liquid to a substrate, the plating apparatus comprising:
   a substrate holding device configured to hold and rotate the substrate;
   a first discharge device configured to discharge the plating liquid toward the substrate held by the substrate holding device; and
   a top plate that is provided above the substrate and has an opening configured to penetrate the top plate,
   wherein the first discharge device includes a first discharge unit configured to discharge the plating liquid toward the substrate,
   the first discharge unit is configured to be moved between a discharge position where the plating liquid is discharged and a standby position where the plating liquid is not discharged, and
   the first discharge unit is configured to be overlapped with the opening of the top plate at the discharge position.

2. The plating apparatus of claim 1, wherein a heater is provided at the top plate.

3. The plating apparatus of claim 1, wherein the opening of the top plate is formed to extend from a central portion of the top plate to an outer peripheral edge of the top plate, and
   the first discharge unit of the first discharge device is arranged along a radial direction of the substrate, and includes multiple discharge openings through which the plating liquid is discharged toward the substrate or includes a discharge opening extended along the radial direction of the substrate.

4. The plating apparatus of claim 1, further comprising:
   a second discharge device configured to discharge a processing liquid to the substrate held by the substrate holding device,
   wherein the second discharge device includes a second discharge unit configured to discharge the processing liquid toward the substrate.

5. The plating apparatus of claim 4, wherein the second discharge unit of the second discharge device is configured to be horizontally moved while discharging the processing liquid.

6. The plating apparatus of claim 4, wherein the top plate is configured to be moved between a first position and a second position above the first position, and
   when the first discharge device discharges the plating liquid toward the substrate, the top plate is positioned at the first position, and when the second discharge device discharges the processing liquid toward the substrate, the top plate is positioned at the second position.

7. The plating apparatus of claim 1, wherein the top plate includes a processing liquid discharge opening through which the processing liquid is discharged toward the substrate.

* * * * *